US010369625B2

(12) United States Patent
Shah et al.

(10) Patent No.: US 10,369,625 B2
(45) Date of Patent: Aug. 6, 2019

(54) ARCUATE DIRECTIONALLY SOLIDIFIED COMPONENTS AND MANUFACTURE METHODS

(71) Applicant: United Technologies Corporation, Hartford, CT (US)

(72) Inventors: Dilip M. Shah, Glastonbury, CT (US); Paul D. Genereux, Stuart, FL (US); Alan D. Cetel, West Hartford, CT (US); John J. Marcin, Jr., Marlborough, CT (US); Steven J. Bullied, Pomfret Center, CT (US); Mario P. Bochiechio, Vernon, CT (US); Kevin W. Schlichting, South Glastonbury, CT (US); Bradford A. Cowles, Tolland, CT (US); Carl R. Verner, Windsor, CT (US); David U. Furrer, Marlborough, CT (US); Venkatarama K. Seetharaman, Rocky Hill, CT (US)

(73) Assignee: United Technologies Corporation, Farmington, CT (US)

( * ) Notice: Subject to any disclaimer, the term of this patent is extended or adjusted under 35 U.S.C. 154(b) by 753 days.

(21) Appl. No.: 14/731,768

(22) Filed: Jun. 5, 2015

(65) Prior Publication Data
US 2016/0031006 A1    Feb. 4, 2016

Related U.S. Application Data

(60) Provisional application No. 62/009,037, filed on Jun. 6, 2014.

(51) Int. Cl.
*B22D 27/04*    (2006.01)
*B22D 7/04*    (2006.01)
(Continued)

(52) U.S. Cl.
CPC ............... *B22D 27/04* (2013.01); *B22D 7/04* (2013.01); *B22D 19/0054* (2013.01); (Continued)

(58) Field of Classification Search
CPC ...... B22D 27/04; B22D 27/045; B22D 27/13; B22D 19/0054; B22D 21/025; B22D 25/02
See application file for complete search history.

(56) References Cited

U.S. PATENT DOCUMENTS

| 4,702,782 A | 10/1987 | Chin |
| 4,862,947 A | 9/1989 | Horton et al. |

(Continued)

FOREIGN PATENT DOCUMENTS

| EP | 1580306 A2 | 9/2005 |
| WO | 00/51761 A1 | 9/2000 |

OTHER PUBLICATIONS

European Search Report for European Patent Application No. 15001687.1, dated Oct. 15, 2015.
(Continued)

*Primary Examiner* — Kevin P Kerns
*Assistant Examiner* — Steven S Ha
(74) *Attorney, Agent, or Firm* — Bachman & LaPointe, P.C.

(57) ABSTRACT

A method for casting comprising: providing a seed, the seed characterized by: an arcuate form and a crystalline orientation progressively varying along an arc of the form; providing molten material; and cooling and solidifying the molten material so that a crystalline structure of the seed propagates into the solidifying material.

22 Claims, 10 Drawing Sheets

(51) Int. Cl.

| | |
|---|---|
| *B22D 27/13* | (2006.01) |
| *C30B 11/14* | (2006.01) |
| *F01D 5/02* | (2006.01) |
| *F01D 5/28* | (2006.01) |
| *F01D 25/00* | (2006.01) |
| *F23R 3/00* | (2006.01) |
| *C30B 13/34* | (2006.01) |
| *C30B 15/36* | (2006.01) |
| *C30B 29/52* | (2006.01) |
| *C30B 29/60* | (2006.01) |
| *B22D 19/00* | (2006.01) |
| *B22D 21/02* | (2006.01) |
| *B22D 25/02* | (2006.01) |
| *C22C 19/03* | (2006.01) |
| *F01D 11/08* | (2006.01) |
| *F01D 25/24* | (2006.01) |
| *F01D 5/14* | (2006.01) |
| *F01D 5/34* | (2006.01) |

(52) U.S. Cl.
 CPC ........... *B22D 21/025* (2013.01); *B22D 25/02* (2013.01); *B22D 27/045* (2013.01); *B22D 27/13* (2013.01); *C22C 19/03* (2013.01); *C30B 11/14* (2013.01); *C30B 13/34* (2013.01); *C30B 15/36* (2013.01); *C30B 29/52* (2013.01); *C30B 29/607* (2013.01); *F01D 5/02* (2013.01); *F01D 5/28* (2013.01); *F01D 11/08* (2013.01); *F01D 25/005* (2013.01); *F01D 25/24* (2013.01); *F23R 3/00* (2013.01); *F23R 3/002* (2013.01); *F01D 5/14* (2013.01); *F01D 5/34* (2013.01); *F05D 2220/30* (2013.01); *F05D 2230/211* (2013.01); *F05D 2230/237* (2013.01); *F05D 2240/11* (2013.01); *F05D 2240/24* (2013.01); *F05D 2240/35* (2013.01); *F05D 2240/55* (2013.01); *F05D 2300/175* (2013.01); *F05D 2300/605* (2013.01); *F05D 2300/607* (2013.01); *F23R 2900/00018* (2013.01)

(56) References Cited

U.S. PATENT DOCUMENTS

| | | |
|---|---|---|
| 4,961,818 A | 10/1990 | Benn |
| 6,969,240 B2 | 11/2005 | Strangman |
| 8,206,117 B2 | 6/2012 | Strangman et al. |
| 2005/0025613 A1 | 2/2005 | Strangman |
| 2005/0211408 A1* | 9/2005 | Bullied ............... B22D 27/045 164/122.2 |
| 2009/0162205 A1 | 6/2009 | Strangman et al. |
| 2012/0156044 A1 | 6/2012 | Ortiz |
| 2014/0060708 A1 | 3/2014 | Shah et al. |

OTHER PUBLICATIONS

European Office action for European Patent Application No. 15001687.1, dated Mar. 8, 2018.

\* cited by examiner

ARCUATE DIRECTIONALLY SOLIDIFIED COMPONENTS AND MANUFACTURE METHODS

CROSS REFERENCE TO RELATED APPLICATION

Benefit is claimed of U.S. patent application Ser. No. 62/009,037, filed Jun. 6, 2014, and entitled "Arcuate Directionally Solidified Components and Manufacture Methods", the disclosure of which is incorporated by reference herein in its entirety as if set forth at length.

BACKGROUND

The disclosure relates to gas turbine engines. More particularly, the disclosure relates to manufacture of disks.

In typical manufacture of nickel-based superalloy disks (e.g., for gas turbine engine turbine sections or high pressure compressor (HPC) sections), manufacture is by forging of powder metallurgical (PM) or cast forms.

In distinction, only casting techniques are typically used to form blades, vanes, and combustor panels. Many blades are manufactured by single crystal casting techniques. In an exemplary single crystal casting technique, a seed of single crystal material is used to define a crystalline orientation that propagates into the cast blade alloy as it cools and solidifies.

In casting blades, etc., it is well known that removal of high angle grain boundaries (<10°) in single crystal nickel base superalloys leads to improved creep resistance and consequently enhances its temperature capability. In addition, it is also known that by properly orienting the low modulus <100> direction along the direction in which high thermal strain exists, the thermal mechanical fatigue (TMF) capability of the material can also be significantly improved.

However, direct application of nickel base superalloy single crystal to a component such as a turbine disk, has not been practical. This is so because loading of such components due to high rotation speed around an axis is axially symmetric and will lead to uneven strain distribution in a single crystal body, with cubic symmetry and anisotropic elastic and plastic properties.

One method to achieve an axially symmetric ring is to bond separately cast single crystal segments. This has been considered by U.S. Pat. No. 8,206,117 B2 entitled "Turbine component and method of manufacturing turbine component", by Strangman and Tolpygo. However, this approach requires bonding between circumferential segments, in the high temperature area, which is likely to create weak points.

Another approach is described in U.S. Pat. No. 6,969,240 B2 entitled "Integral turbine composed of a cast single crystal blade ring diffusion bonded to a high strength disk", by Strangman. A single crystal rim is cast along with single crystal blades and then diffusion bonded to a high strength conventional disk. This approach relies on casting the bladed ring using a large number of discrete single crystal seeds such that presence of high angle grain boundaries is avoided. In this approach, for example, if one wishes to limit the grain boundary misorientation to 10°, then ideally 360°/10°=36 discrete single crystal seeds may be required.

SUMMARY

One aspect of the disclosure involves a method for casting comprising: providing a seed, the seed characterized by: an arcuate form and a crystalline orientation progressively varying along an arc of the form; providing molten material; and cooling and solidifying the molten material so that a crystalline structure of the seed propagates into the solidifying material.

A further embodiment may additionally and/or alternatively include partially melting the seed.

A further embodiment may additionally and/or alternatively include the cooling and solidifying comprising passing a solidification front through an arcuate planform passageway passing radially back and forth in a non-line-of-sight manner.

A further embodiment may additionally and/or alternatively include the seed having weld or braze joint.

A further embodiment may additionally and/or alternatively include the weld or braze joint being partial height.

A further embodiment may additionally and/or alternatively include the seed being a full annulus.

A further embodiment may additionally and/or alternatively include forming the seed by: casting at least one precursor of the seed; and bending the at least one precursor into said arcuate form.

A further embodiment may additionally and/or alternatively include forming the seed by bending at least one precursor of the seed into said arcuate form.

A further embodiment may additionally and/or alternatively include the bending being by at least 40°.

A further embodiment may additionally and/or alternatively include forming the seed by assembling end-to-end a plurality of arcuate segments.

A further embodiment may additionally and/or alternatively include two to eight said segments combining to encircle at least 350° about a central longitudinal axis of the seed.

A further embodiment may additionally and/or alternatively include the assembling comprising one or more of: clamping; welding; and brazing.

A further embodiment may additionally and/or alternatively include the assembling comprising tack welding.

A further embodiment may additionally and/or alternatively include the providing the molten material comprising pouring a molten metal.

A further embodiment may additionally and/or alternatively include: forging the solidified metal; and machining the forged metal.

A further embodiment may additionally and/or alternatively include a pre-forging height to diameter ratio being not greater than 1.0.

A further embodiment may additionally and/or alternatively include: ring rolling the solidified metal; and machining the rolled metal.

A further embodiment may additionally and/or alternatively include the article being one of: a turbine engine disk or component thereof; a blade outer air seal; a combustor panel; or an engine case or component thereof.

A further embodiment may additionally and/or alternatively include the cooling and solidifying comprising downwardly shifting a shell.

A further embodiment may additionally and/or alternatively include the cooling and solidifying comprising upwardly drawing from a melt pool.

A further embodiment may additionally and/or alternatively include the melting comprising a local melting with a heat source moving relative to the seed to melt material while leaving solid material above and below the melted material.

A further embodiment may additionally and/or alternatively include the seed being a full annulus without joints.

A further embodiment may additionally and/or alternatively include a disk manufacture method, comprising: casting a first component according to the method above; and bonding a second component concentrically within the first component.

A further embodiment may additionally and/or alternatively include forging and machining the cast first component prior to the bonding.

Another aspect of the invention discloses a turbine engine rotor component comprising: a continuous structure circumscribing a central aperture along a central longitudinal axis; and a crystalline structure continuously progressively varying around the central longitudinal axis.

A further embodiment may additionally and/or alternatively include the component being one of: a turbine engine disk or component thereof; a blade outer air seal; a combustor panel; or an engine case or component thereof.

A further embodiment may additionally and/or alternatively include the component being a disk rim in combination with a disk bore.

A further embodiment may additionally and/or alternatively include the combination wherein: the disk rim has a [100] axis within 10° of axial; and the disk bore has a [111] axis within 10° of axial.

A further embodiment may additionally and/or alternatively include the structure being a nickel-based superalloy.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

As is described in detail below, a casting method uses one or more bent seeds (e.g., single crystal) to cast an arcuate (e.g., generally annular) component. Exemplary generally annular components may be a disk rim or an entire disk. A full annulus seed may be formed by bending one seed a full 360° and then securing the ends. Alternatively, a plurality of arcuate segments may be assembled end-to-end to form the final seed.

Use of bent seeds to propagate their crystalline orientation into the annular component results in the annular component having a continuously progressively circumferentially changing (relative to a fixed frame of reference) crystalline orientation that essentially remains constant relative to the local surface. Thus, for example, the component may have one given crystalline direction extending radially outward along the entire circumferential extent of the component. In a specific example, the entire disk body is processed by casting and forging a curved single crystal ring.

Figure 1:
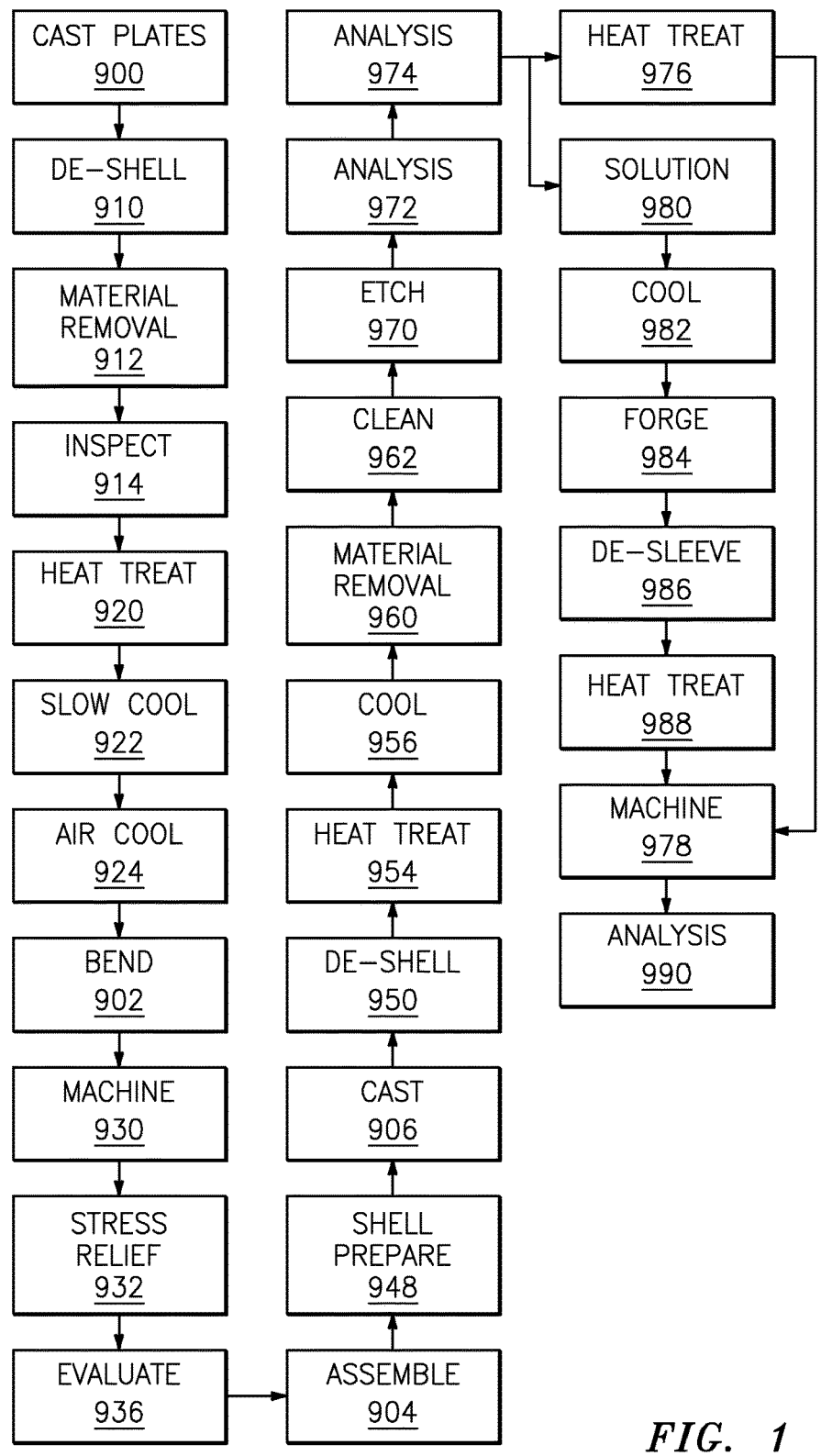
FIG. 1 is a flowchart of a manufacture process.

As shown in the flow chart of FIG. 1, in one exemplary method, single crystal plates are cast 900, bent 902, and assembled 904 into a seed. The seed is used to cast 906 an annular component.

Figure 2:
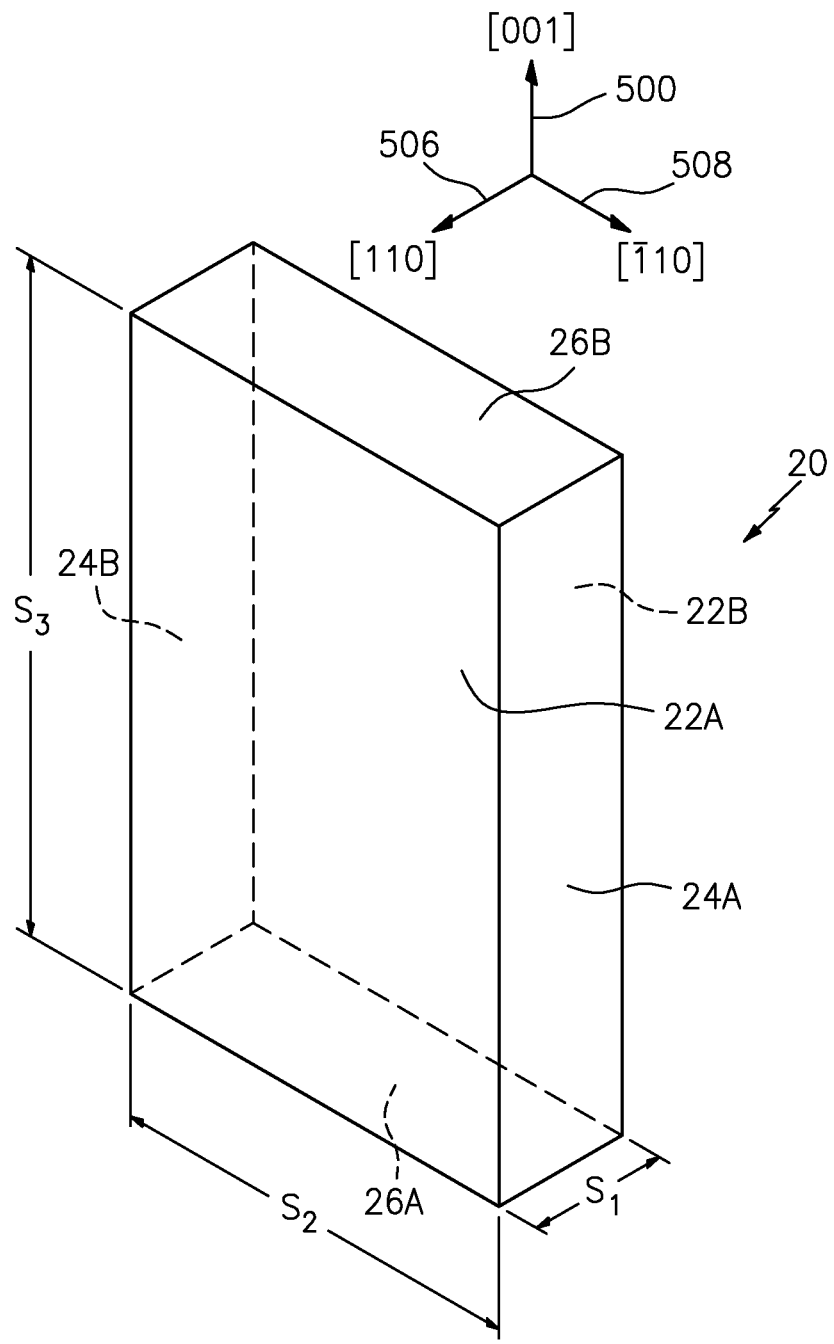
FIG. 2 is a view of a single crystal plate.

Exemplary plates are initially formed as right parallelepipeds. FIG. 2 shows the exemplary plate 20 having opposed pairs of faces: 22A, 22B; 24A, 24B; and 26A, 26B. Exemplary dimensions between the opposite faces of each pair are respectively labeled $S_1$, $S_2$, and $S_3$. In one example, these are in progressively increasing order: 0.125 inch (0.32 cm), 9.0 inches (23 cm), and 2.125 inches (5.4 cm). It is thus seen in this example that one dimension is much longer than the other two. This longer dimension may be appropriate for bending into a seed so that this long dimension becomes the arc of a circular segment.

An exemplary seed material is a superalloy, more particularly, a nickel-based superalloy, more particularly, a superalloy with a solvus temperature greater than 2400° F. (1316° C.). PWA1484 is an exemplary such alloy.

Such plates 20 may be cast in groups as is known, for example, in the casting of blades. Exemplary such casting involves a mold cluster having 6-20 cavities for casting respective plates (more particularly, 14-16 cavities). The molds (or individual mold segments for forming a cluster) may be formed using conventional techniques such as forming a ceramic stucco shell over wax patterns.

Figure 3:
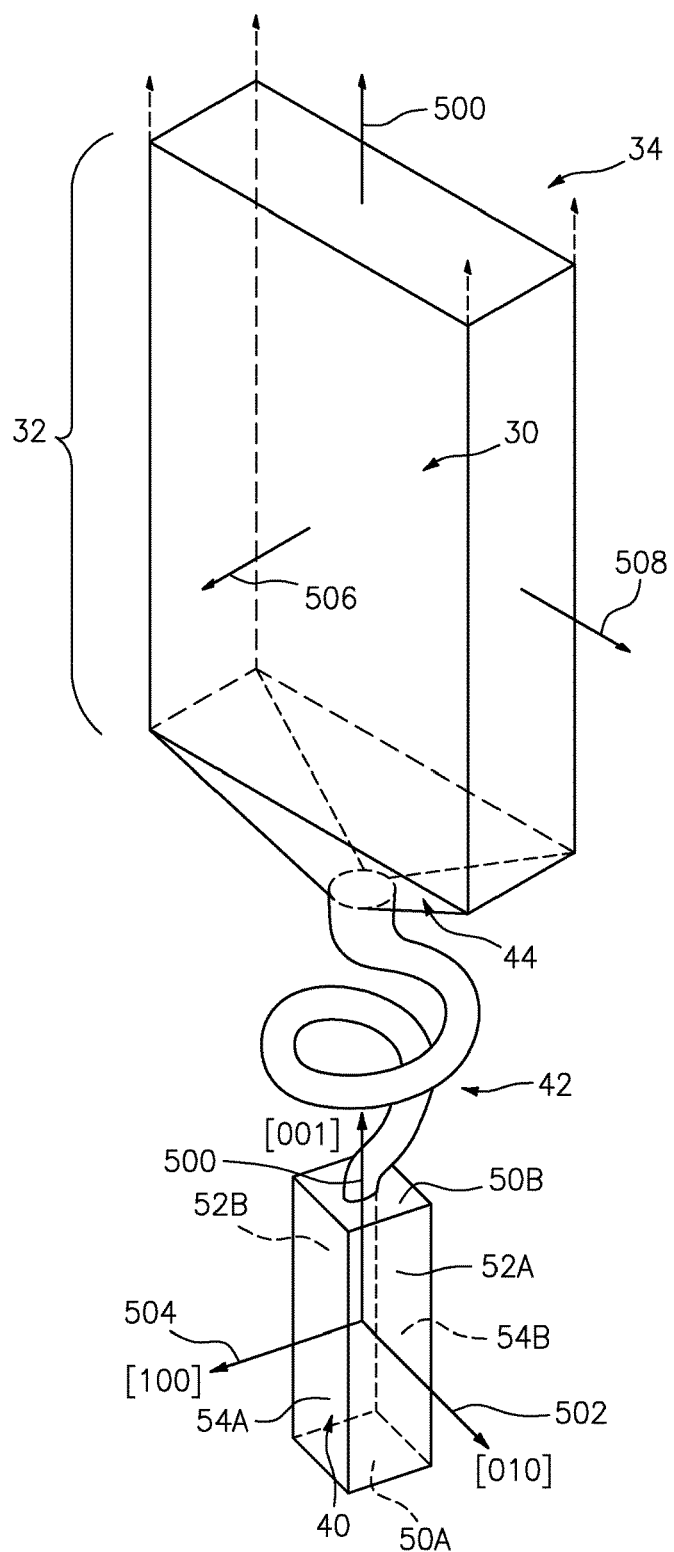
FIG. 3 is a schematic view of a mold cavity for forming the plate of FIG. 2.

FIG. 3 schematically shows the cavity 30 of such a mold. A portion or section 32 of the cavity generally corresponds to the volume in which the seed 20 is cast. There may be a headspace 34 of the cavity thereabove.

FIG. 3 shows a casting seed 40 associated with the cavity 30. In this example, which is typical of blade casting configurations, the seed connects to the main portion of the cavity 30 via a spiral (helical) grain starter passageway 42 extending upward from the seed to a gating region 44 which diverges outwardly to join the cross-section of cavity portion 32 corresponding to the ultimate seed. In this example, the main portion 32 of the cavity is vertically elongate to correspond to the long dimension $S_3$ and has a transverse footprint corresponding to the dimensions $S_2$ and $S_1$ (e.g., potentially reflecting slightly greater size to allow for machining (if any) of the plate 20 to final specification).

The exemplary seed 40 is a right parallelepiped having a bottom 50A, a top 50B, a first pair of sides 52A, 52B, and a second pair of sides 54A, 54B. FIG. 3 shows an exemplary vertical direction 500. A surface normal of the seed face 52A is shown as 502 and a surface normal of the face 54A is shown as 504. A direction corresponding to the surface normal of the face 22A of the plate is shown as 506 and a direction corresponding to the surface normal of the face 24A is shown as 508.

Exemplary seeds 40 are of single crystal nickel-based superalloy. More particularly, they may be of the same material used to form the plates. Exemplary seeds 40 are square-sectioned and vertically elongate (e.g., of dimensions 0.5 inch (1.3 cm)×0.5 inch (1.3 cm)×2 inch (5.1 cm). As shown in FIGS. 2 and 3, seeds 40 are oriented in an [001]-upward direction relative to the cavity 30 and to cast the plates such that normal 506 and 508 are parallel to [110] or [−1,1,0] directions, respectively, which are orthogonal to [001] directions. In this example, viewed downward, the direction 506 is rotated 45° counterclockwise about the direction 500 relative to the direction 504 and the direction 508 is 45° counterclockwise of the direction 502.

As in conventional single-crystal casting, the individual seeds 40 may be obtained by machining out blocks from: (a) naturally cast material (cast without seeding) <001> oriented single crystal; or (b) material cast using another seed. In a conventional manner, the investment casting mold cluster (not shown) may be placed or assembled on a water-cooled copper chill plate in a commercially available directional solidification furnace in such a way that a lower portion (e.g., the bottom half) of the seeds remain solid when the mold is heated to the melt temperature of the alloy (e.g., in excess of 2600° F. (1427° C.)). Molten metal is poured to fill the mold and then the mold is withdrawn downwardly from the hot zone of the furnace (e.g., at a rate of 4-20 inches (10-51 cm), more narrowly, 4-10 inches (10-25 cm) per hour). This allows the crystalline orientation of the unmelted bottom portion of the seeds which is kept solid to propagate into the solidifying metal. The helical connectors 42 between the seeds and the plate is a standard casting practice to eliminate any stray recrystallized or randomly nucleated grain that may have developed on the surface of the seed.

After solidification, there may be a conventional deshelling 910 of the castings and excess material may be removed 912. For example, the casting will leave the surfaces 22A, 22B and 24A, 24B or precursors thereof. However, there may be cast gating material from the gating region 44 which may then be cut away to form one of the end faces 26A, 26B. Similarly, excess material cast in the headspace 34 to be cut away to form the other surface 26A, 26B. Additional machining as part of step 912 may remove any final shell material and/or true up the surfaces. Yet further machining may cant the surfaces to improve assembly upon subsequent bending. For example, the surfaces 26A, 26B may be angled to converge toward each other so as to allow close mating after assembly of bent plates.

Various inspection steps 914 may occur at this or other points. In one exemplary inspection of the cleaned/machined plates, the plates are macroetched to reveal any grain defects. Plates that pass said inspection stage may be further evaluated using X-ray Laue technique to determine crystal orientation. Plates that do not have crystalline orientation within a desired tolerance may be rejected. In one example, plates are accepted only if the primary axis 500 is within a threshold (e.g., 5°) of a [001] direction and the width direction 508 and the thickness direction 506 are within a threshold (e.g., also 5°) of [110] and [−1,1,0] directions respectively.

Acceptable plates may then be solution heat treated 920. Exemplary solution heat treat is for thirty minutes at 2400° F. (1316° C.). This may be followed by a slow cool 922 to a slightly lower temperature (e.g., at a rate of 0.3° F./min to 2000° F. (0.17° C./min to 1093° C.)) and then an air cool 924 (e.g., back to ambient temperature).

Such plates are then handled carefully to avoid impact damage of the surface and slowly bent 902. Exemplary bending is via standard mechanical bending techniques. Exemplary bending is performed at room temperature. Exemplary bending is about directions parallel to 508 so that the span $S_3$ becomes an arc span. In the situation where the final seed is to be an end-to-end assembly of segments, each plate may be bent to approximately the nominal arc span of the final segment. For example, for an assembly of four segments, the nominal arc span would be 90°. The bending may be to within an exemplary 5° or 10° of such nominal value or within an exemplary 5% or 10% of that arc span. In either case, deformation to the final arc span may occur during assembly and securing of the segments. An exemplary number of segments is 1-15. Alternative upper limits on such range are 4, 6, 8, and 10. Alternative lower limits with any of said upper limits are 2, 3, and 4. Thus, for example, an exemplary eight plates each have a final arc span of 45°. As noted above, the initial bending may thus be by at least 40° for such example.

Figure 4:
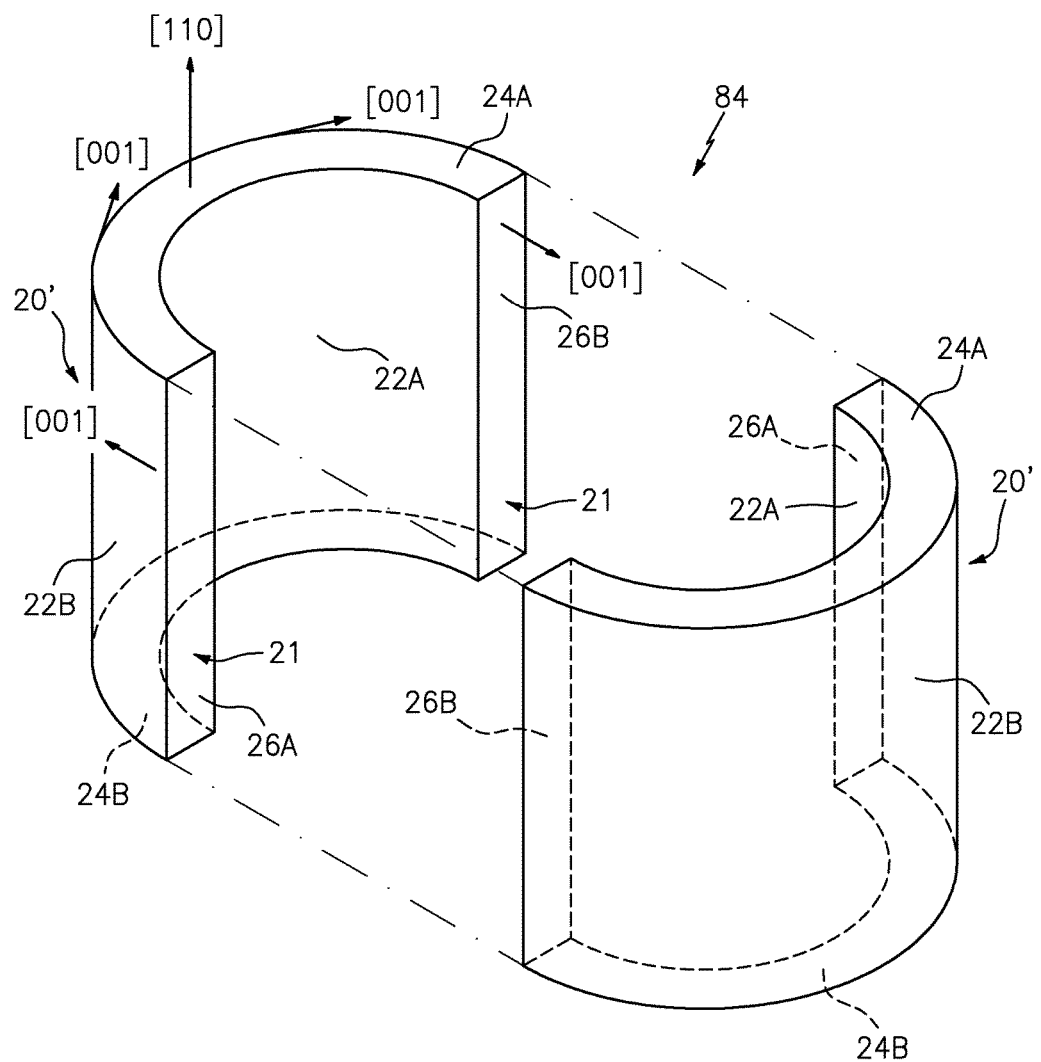
FIG. 4 is an exploded view of an annular seed formed from a pair of bent plates.

FIG. 4 shows a pair of bent plates 20'. For ease of illustration, the respective features of the bent plates are referenced with the same numerals used in FIG. 2. In this example, the bent plates have essentially semicircular planform viewed from above. Thus, in this example, a [001] direction corresponds with a circumferential direction at all points along the arc length of the bent plate.

A final machining 930, if necessary, may precision cut the plates to form a desired full-annulus assembly. For example, the plates may be assembled around a cylindrical mandrel of a given diameter and machined to fit with their respective surfaces 22A engaging the cylinder or having a minimal gap.

A further stress relief 932 step may follow. An exemplary stress relief step involves strapping the two plates together around a mandrel and raising to a temperature less than the solution heat treat temperature (e.g., slightly less than the temperature at the end of the slow cool stage). In this example, the stress relief temperature is 1975° F. (1079° C.). The bent plates may then be re-evaluated/inspected 936 to ensure that no recrystallized grains are formed. X-ray Laue technique may be used to verify that [001] orientation along the axis of the plate curves around the bent plate.

The bent plates may be assembled/secured 904 to each other. Exemplary securing involves welding or diffusion bonding. A particular welding is a tack welding along a lower portion of the annular assembly of plates. FIG. 4 schematically shows the weld in the form of weld zones 21 along lower portions of the surfaces 26A, 26B. Exemplary welds are confined to the lower half of the vertical span of the seed, more particularly, to the lower third. During subsequent casting 906 using the assembled plates as a seed, the tack welded portion remains solid. Thereby, any disturbance to crystalline orientation caused by the tack welding does not affect casting. Accordingly, upper portions of the plates including the portion that melts and some portion therebelow may have a mere abutting engagement between ends 26A, 26B. As noted above, the final assembly may be a full 360° annulus. Alternative assemblies may involve less than a full annulus but may preferably be essentially full annulus (e.g., at least 350°). In the illustrated embodiment, the ends 26A, 26B are at essentially right angles to the adjacent surfaces and therefore radial when viewed in the context of the overall seed assembly 84 and its central longitudinal axis. Alternative implementations may partially tangentially orient these ends. This provides greater mating surface of the abutting pairs of ends and also can create a more gradual transition in any crystalline propagation associated with the two distinct pieces (i.e., circumferentially around the seed at the joint the cross-section will progressively transition between the two pieces 20'). Such exemplary angles may be from 0° to an exemplary 60° off-radial, more particularly, 30°-60°.

Figure 5:
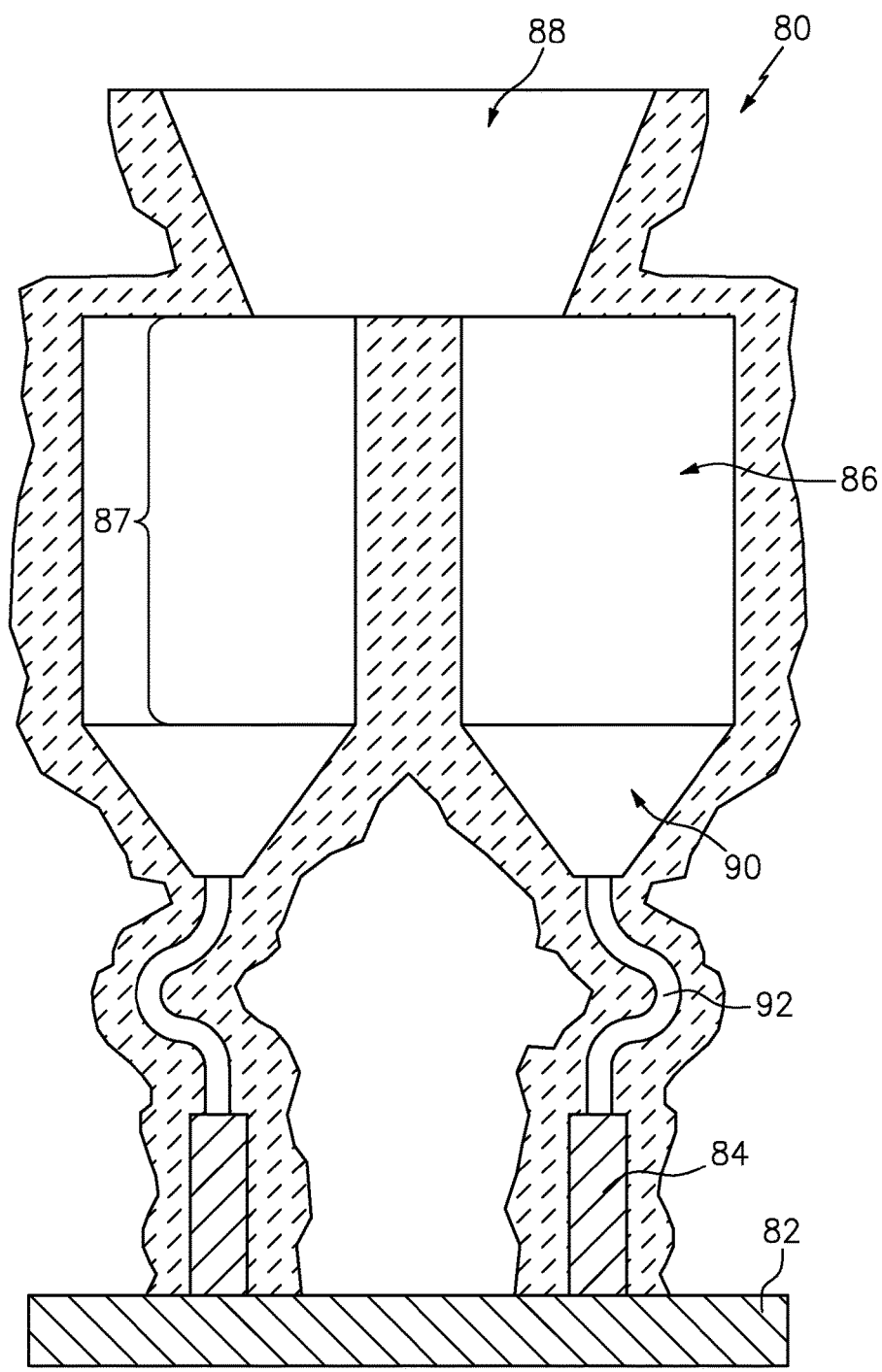
FIG. 5 is a partially schematic central vertical sectional view of a shell for casting a disk precursor using the seed of FIG. 4.

FIG. 5 shows a shell 80 atop a chill plate 82. The shell contains a seed 84 formed by the assembled bent plates. The shell contains an annular cavity 86 having a portion 87 for forming an annular disk precursor. A pour cone 88 is also shown above the cavity 86. To provide communication with the seed 84, an annular gating region 90 is at a lower end of the cavity portion 87 and communicates with the seed via an annular grain starter 92. The grain starter 92 attempts to mimic the function of a helical grain starter. However, due to its annular nature, its cross-section shifts radially inward and outward instead of spiraling. The exemplary shift is enough to avoid line-of-sight between the lower end of the grain starter and the upper end.

The shell 80 may be prepared 948 by conventional techniques of shelling assembled wax pattern components.

The exemplary cavity portion 87 is sized to cast an approximately 7 inch (18 cm) tall ring of 6 inch (15 cm) outer diameter and 1 inch (2.5 cm) inner diameter. After the shell is de-waxed and fired, the bent plate seed assembly 84 may be inserted from the bottom into the seed cavity. The seed cavity is designed taking into account the differential thermal expansion between the seed alloy and the mold material.

Once again the assembled investment casting mold is placed on a water cooled copper chill plate in a commercially available directional solidification furnace in such a way that bottom half of the seed 84 remains solid when the mold is heated to a melt temperature of the alloy (e.g., in excess of 2600° F. (1427° C.).

Figure 6:
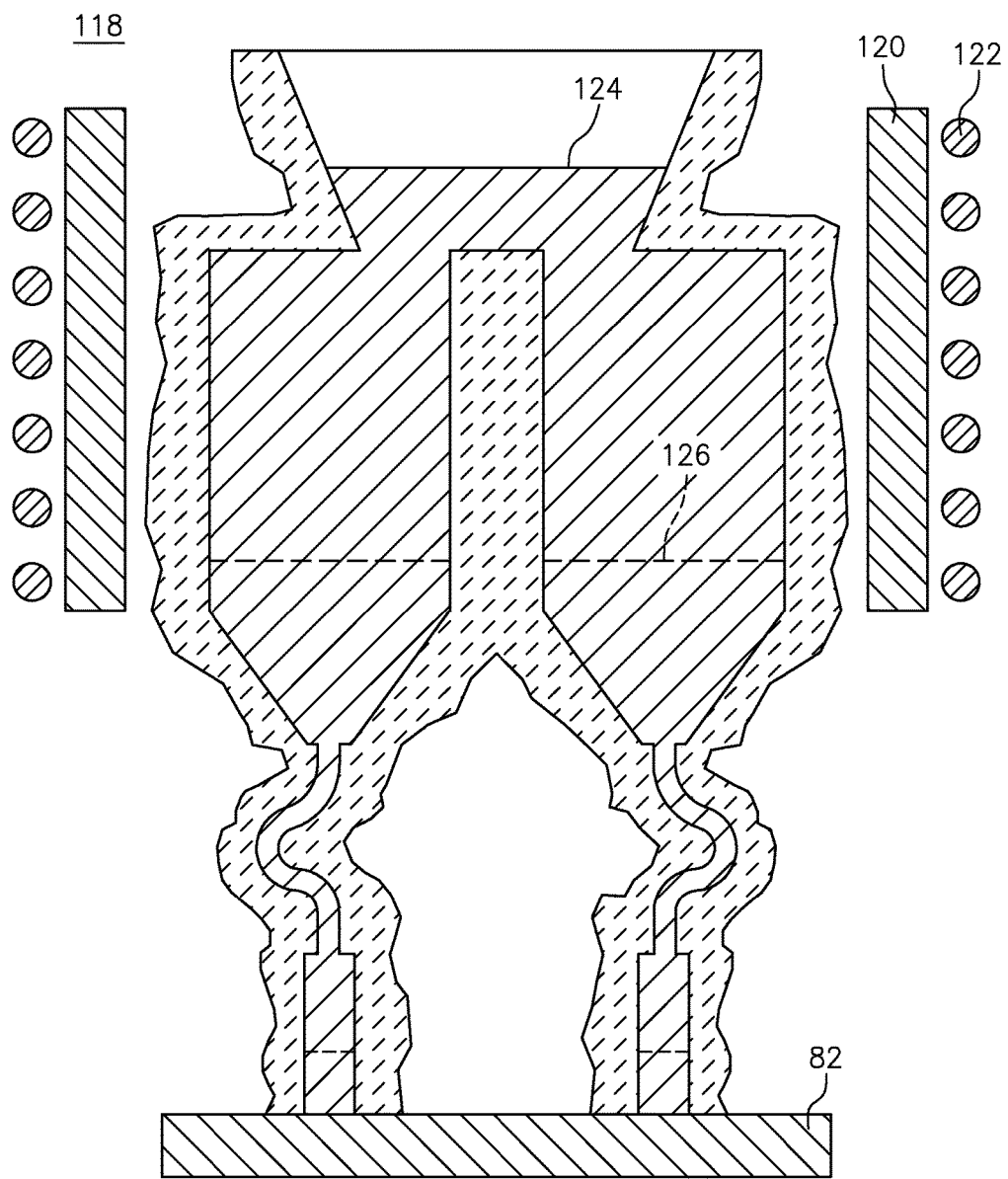
FIG. 6 is a partially schematic central vertical sectional view of the shell of FIG. 4 during casting in a furnace.

FIG. 6 shows the shell 80 in an induction furnace after pouring of metal but during withdrawal/solidification. The furnace includes a susceptor 120 surrounded by an induction coil 122. Molten metal 123 fills the shell to a surface level 124 with a solidification front 126 shown near the base of the susceptor.

Molten metal composition is poured into the pour cone to fill the mold and then the mold is withdrawn from the hot zone of the furnace (e.g., at a rate of 4-10 inches (10-25 cm) per hour). This allows molten metal to copy the crystalline orientation of the bottom portion of the seed 84 which is kept solid. In this case, unlike the normal seeding process, the crystalline orientation of the seed 84 at each circumferential location is copied to the cylindrical component above. As long as the transverse temperature in the casting furnace is sufficiently uniform, this results in a single crystal ring with the axis 500 having the [110] orientation identical to that along the width of the seed plate and the hoop of the ring curving along the [001] direction tangentially following the circumference of the curved plates.

As is discussed further below, the molten metal may be of the same composition used for the seed 84 and/or seed 40 or of a different composition. For example, the composition of the seed 40 may be selected merely for its seeding properties. The composition of the seed 84 may also be chosen for its seeding properties. In the example above, these are both PWA 1484. However, the material of seed 84 may be modified if this would facilitate the bending, etc. Additionally, it may develop that certain materials have better relative abilities to seed when bent than others compared with unbent states. However, in a first example, the subsequent molten metal is selected for the properties of the ultimate casting.

In alternative embodiments (including other embodiments discussed below) this step may be used to cast more seeds. For example, the annular bent seed assembly 84 may be used to cast a tube-like structure which is then axially segmented and the individual annular segments used as seeds to cast final components. Such a process may be used if the additional step does not adversely affect final crystalline orientation and may be economically advantageous.

In the first example, after a routine deshelling 950 process, the casting is solution heat treated 954 (e.g., at 2400° F. (1316° C.) for 30 minutes) and then air cooled 956. After the solution heat treatment, the standard procedure currently used for single crystal turbine blades may be followed. First seed, and other extraneous material is cut off 960, and the surface cleaned 962, to provide the desired ring component. This is then macroetched 970 to reveal grain defects, if any (e.g., to become visible to the naked eye).

If grain defects are found, then Laue analysis 972 is needed to define grain misorientation. For the exemplary alloy PWA 1484, if the misorientation is less than a threshold value (e.g., 6°), then the ring may be considered an acceptable single crystal. Anything with misorientation greater than that may be acceptable if the defect is limited to a small region or anticipated to be machined out in subsequent operation or is in an area not deemed critical from a structural point of view.

Beyond this though, the resulting large curved single crystal may advantageously be subjected to a more extensive X-ray Laue analysis 974 at multiple locations than is a cast blade. This may be achieved by taking multiple (e.g., 24 to 30 for full annulus or at least three for every 45° of arc) X-ray Laue patterns along the top of the ring, parallel to the ring axis 500, evenly spaced interval along the circumference. The objective of this analysis is to verify; (a) that axial orientation at each location deviates no more than a specified angle (e.g., 10°) from the target (e.g., [110]) orientation; and (b) the projection of the second target (e.g., [001]) orientation in the plane normal to the axis of the disk is within a specified range (e.g., ±10°) of the local tangential direction. As has been the case with prior art single crystal blades, the specified angular tolerance is generally determined by a combined consideration of casting yield and structural requirements.

Alternatively the cast ring may be evaluated by nondestructive evaluation (NDE) technique based on sound velocity locally and/or globally. Measurement of sound velocity near the surface or through the volume allows one to determine elastic modulus, which in turn allows one to define the acceptable range of crystal orientation. This methodology is not direct but is more suitable for a large component like this.

Such a cast ring may then be given an additional heat 976 treatment (e.g., of 1975° F./4 hrs (1079° C./4 hours)) and a precipitation hardening cycle (e.g., of 1600° F./32 hours (871° C./32 hours)) and appropriately machined to form a bladed rim or simply an outer rim to be bonded to a conventional fine grained disk which will form the high strength bore of the disk. In a bladed rim for example, the single crystal orientation may be such that blade axis 500 is along [010]. That does not change the rest of the method described here. In either example, the rim may be machined 978 to form blades or features (e.g., slots) for mounting blades.

Figure 7:
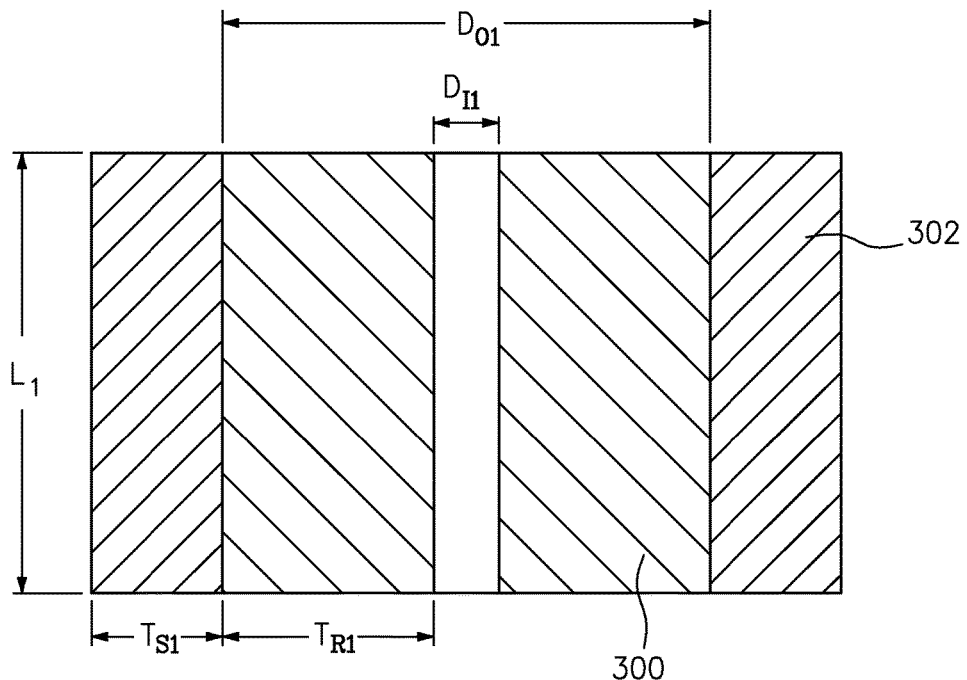
FIG. 7 is a central axial sectional view of the cast precursor after encapsulation in a sacrificial sleeve.
Figure 8:
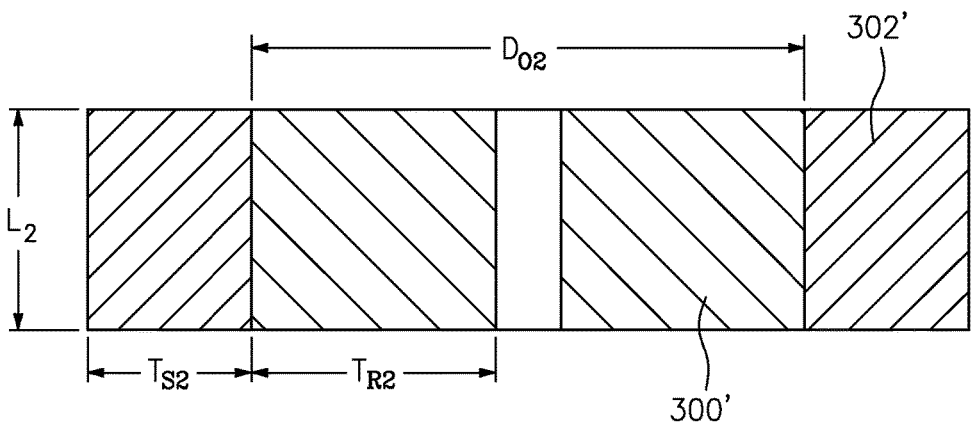
FIG. 8 is a central axial sectional view of the precursor of FIG. 7 after forging.

However, a particular approach is to forge the single crystal ring at least to some degree. Such a warm working increases dislocation density and makes plastic response of cast single crystal much more uniform. Generally low temperature (<1600° F. (<871° C.)) creep response to small strain (e.g., of 0.1-0.5%) is improved with suppression of primary creep. To forge the ring, the cast ring is re-solutioned 980 (e.g., at 2400° F. (1316° C.)) and slow cooled 982 (e.g., at 0.3° F./min (0.17° C./min) to 2000° F. (1093° C.) to coarsen the gamma prime precipitates. In this condition then the part is forged 984 isothermally (e.g., at 2000° F. (1093° C.) at a strain rate of 0.01-0.10 inch/inch/min (cm/cm/min) or slower to reduce the height (e.g., by ~50%, more broadly, 40%-60%). To achieve uniform deformation, keeping the aspect ratio of height to diameter to be less than (or at least not more than) 1.0 is desirable. The ring may be machined down to this aspect ratio. This includes the possibility of cutting multiple rings from a casting of greater height. Also it is desirable that the ring be enclosed in a sacrificial outer container (sleeve) (e.g., with wall thickness at least one third the outer radius of the ring). This serves to keep the shape circular and provide evenness of the foregoing deformation. FIGS. 7 and 8 schematically illustrate the step with cast ring 300 and sleeve 302. The initial length of both the ring and sleeve is shown as $L_1$. The initial ring outer diameter and sleeve inner diameter is shown as $D_{O1}$. The initial ring inner diameter is shown as $D_{I1}$. The sleeve thickness is shown as $T_{S1}$ and the ring thickness is shown as $T_{R1}$. After forging (FIG. 8) the ring and sleeve are shown as 300' and 302' with length $L_2$. $D_{O1}$ has expanded to $D_{O2}$. The exemplary forging is such that $L_1$ is initially less than or equal to $D_{O1}$ but is decreased by the amounts mentioned above to $L_2$. After forging the sacrificial sleeve 302' is cut and discarded 986. The as-forged ring 300' is then finally heat treated 988 (e.g., for 32 hours at 1600° F. (871° C.) and is ready for machining 978.

After the forging, the X-ray Laue technique is generally not usable to ensure that no undesirable recrystallization has taken place. But in lieu, X-ray texture analysis 990 (before or after the machining) investigation can be performed to track the crystalline texture of the material. Alternatively, once again at this stage an NDE technique based on sound velocity may be employed, to achieve the same goal. In production, an array of detectors may be used to provide desired elastic modulus/orientation information at as many points as desired for quality assurance.

Depending on the desired performance and engineering requirements, optimum balance of tensile and creep properties may be achieved by varying: (1) the cooling rate from the solution temperature; aspect ratio prior to forging; and (3) forging rate within 5-10× bound of the numbers specified. For a different nickel base superalloy, the solution temperature, grain misorientation acceptance standard, and forging parameters are expected to change for optimum performance.

Three distinct classes of nickel base superalloys for casting using seed 84 are discussed below. First, nickel and iron base alloy IN 718 (and similar) is already widely used in polycrystalline cast disks. The alloy has the ability to provide strengthening via two different types of precipitates, of which one forms at lower temperature. These lower temperature precipitates may have a particularly significant advantage of increasing strength of forged single crystal. Exemplary IN-718 derivative alloys have a weight percentage composition of carbon 0.02-0.6, chromium 15-22, molybdenum 0-9, tungsten 0-3, cobalt 0-9, iron 2.5-40, niobium 2.9-6.5, titanium 0.2-1.8, aluminum 0.2-1.45, boron 0-0.005, remainder nickel plus impurities.

Another class of alloys which has been developed specifically for cast and PM turbine disk applications have moderately high amount of grain boundary strengthening elements such as carbon, boron, zirconium and hafnium. Such alloys generally display high tensile properties at lower temperature, and greater fracture resistance and are likely to display greater tolerance to grain defects (as would be inherent in the bent seed casting). The combination of attributes may help mitigate manufacturing risk. For both class of alloys, the present bent seed approach is expected to enhance their temperature performance relative to their current use in polycrystalline form. Exemplary compositions of such gamma prime precipitation strengthened nickel-base disk alloy comprise, by weight percentage, carbon 0.03-0.35, chromium 9-30, molybdenum 3-10, tungsten 0-8, cobalt 0-20, niobium 0-3.6, titanium 1-5, aluminum 1-5, boron 0.001-0.04, tantalum 0-10, zirconium 0-0.2, hafnium 0-1, vanadium 0-0.8, remainder nickel and impurities.

The third class of alloys was developed for single-crystal blade applications. These are most creep resistant and are most attractive for achieving the highest temperature performance. However, such alloys are likely to show lowest tolerance to grain boundary defects. Exemplary such superalloys comprise, by weight percent, carbon 0-0.08, chromium 2-13, molybdenum 0-6, tungsten 4-12.5, cobalt 0-20, niobium 0-.6, titanium 0-5, aluminum 3-6.5, boron 0-0.018, tantalum 3-12.5, zirconium 0-0.05, hafnium 0-1.2, rhenium 0-6, ruthenium 0-6, remainder nickel and impurities.

Yet other potential alloys include refractory metal-based alloys.

Figure 9:
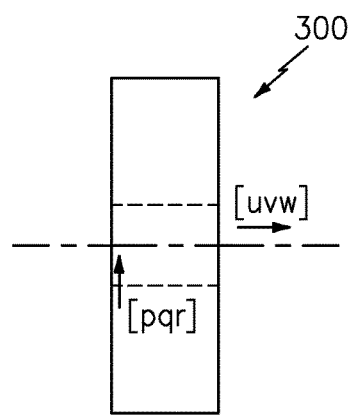
FIG. 9 is a side view of a casting.
Figure 10:
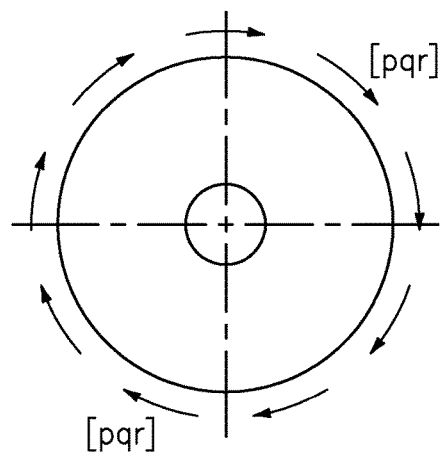
FIG. 10 is an end view of the casting of FIG. 9.

The foregoing example gave one particular set of crystalline orientations. However, the process can be used with any combination of axial and circumferential crystalline orientations which are orthogonal to each other. As shown in FIGS. 9 and 10, the single crystal ring 300 has axial orientation [uvw], with orthogonal orientation [pqr] curving around the circumferential direction. Of these, a few specific combination pairs are of initial interest depending on the design and end application intent. This is summarized in Table I.

TABLE I

| Exemplary Crystalline Orientations | | |
| --- | --- | --- |
| Axial Orientation [uvw] | Circumferential Orientation [pqr] | Potential Applications |
| [110] | [001] | disk with separate blades provides low modulus rim with TMF durability without compromising bore performance |
| [100] | [001] | TMF resistant bladed rim or IBR |
| [111] | [−1, −1, 2] or [−1, 1, 0] | applications high modulus, high strength bore (used with separate rim) |

Similarly, a variety of bonded combinations of rim and bore materials are possible, of which the combinations listed in Table II are of specific interest.

Figure 11:
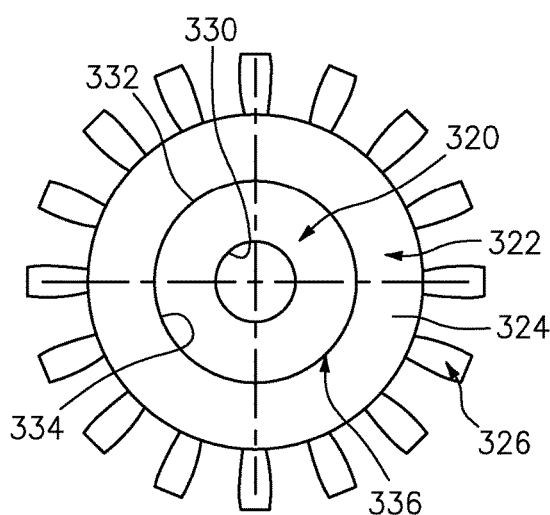
FIG. 11 is an end view of an integrally bladed rotor.

FIG. 11 shows a disk formed with a bore 320 bonded to an integrally bladed rim 322. The rim 322 includes a ring portion 324 and a circumferential array of blades 326 extending from an outer diameter (OD) surface of the ring to free tips. The exemplary blades 326 are airfoils extending from a leading edge to a trailing edge and having a pressure side and a suction side between such edges. The bore 320 has an inner diameter (ID) surface 330 (circumscribing a central aperture along a control longitudinal axis 580) and an outer diameter (OD) surface 322. The ring 324 has an ID surface 334 (similarly circumscribing a central aperture along the axis 580) mated to the OD surface 332 and bonded thereto by a bond 336 (e.g., via friction welding or other bonding process). From the part's point of view, the axis 580 is coincident with various of the aforementioned central longitudinal axes of part precursors and annular seeds.

Figure 12:
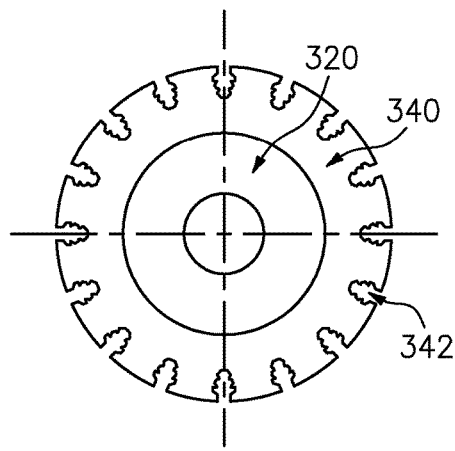
FIG. 12 is an end view of a rotor disk.

FIG. 12 shows an otherwise similar disk but where a ring 340 replaces the ring 324 and has a circumferential array of blade retention slots 342 in its OD surface. The slots 342 receive the fir tree roots of blades (not shown) which may be separately formed and may be conventional cast single crystal blades. Generally the intent of bonding rim or bladed rim to bore is to achieve optimum high temperature performance of blades and rim while maintaining low temperature tensile strength of the bore.

TABLE II

Exemplary Rim-Bore Combinations

| Rim (and optional blades) | Bore | Application |
| --- | --- | --- |
| [100] axial/[001] circumferential single crystal bladed rim | conventional fine grained polycrystalline cast or PM material | compressor disk or drum rotor |
| [100] axial/[001] circumferential single crystal rim (separate blades) | conventional fine grained polycrystalline cast or PM material | turbine disks requiring higher temperature performance |
| [100] axial/[001] circumferential single crystal bladed rim | [111] axial/[−1, −1, 2] or [−1, 1, 0] single crystal bore | compressor disk or drum rotor requiring high strength bore |
| [100] axial/[001] circumferential single crystal rim (separate blades) | [111] axial/[−1, −1, 2] or [−1, 1, 0] single crystal bore | turbine disks requiring higher temperature performance and high strength bore |

Figure 13:
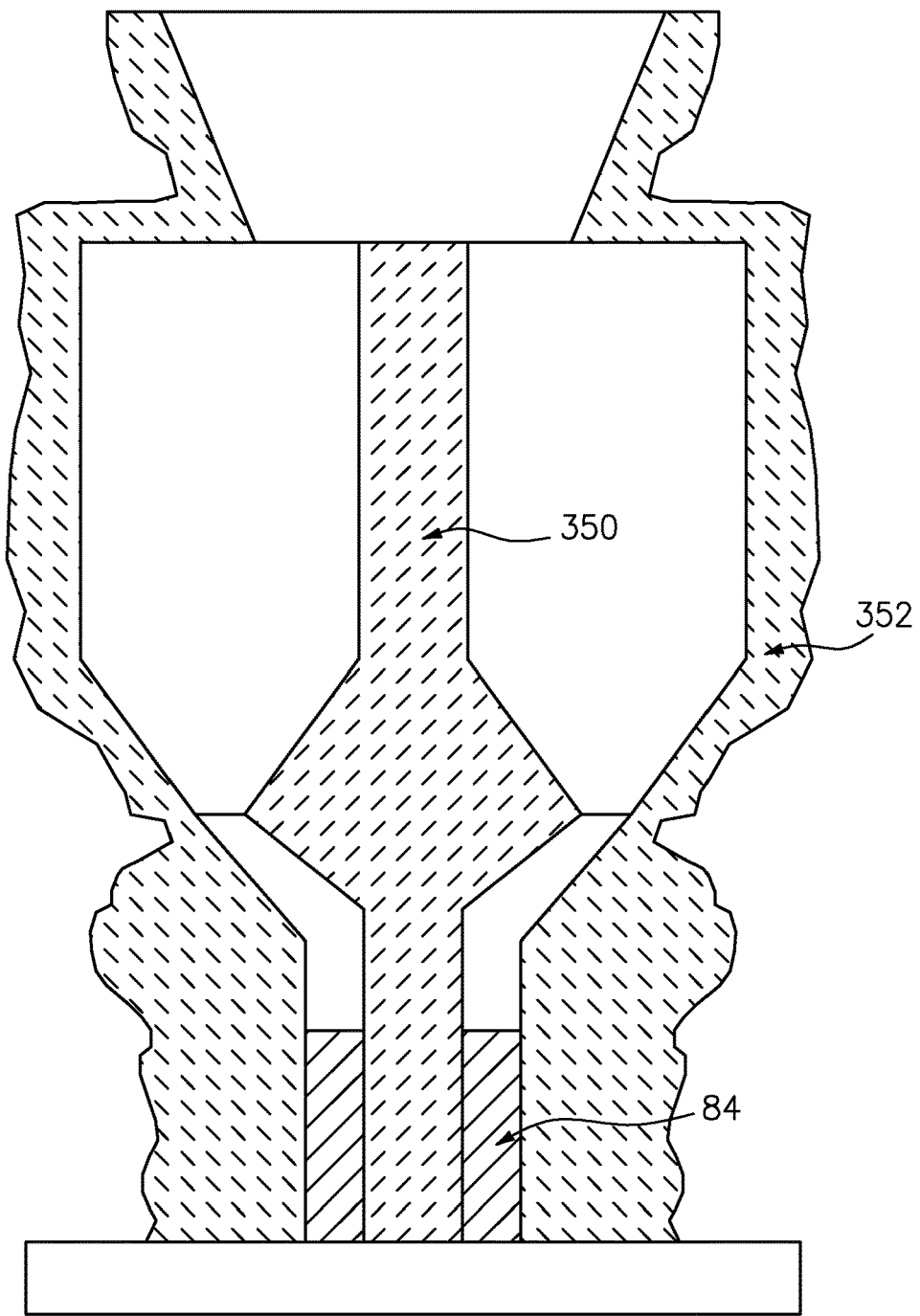
FIG. 13 is a partially schematic central vertical sectional view of a second shell for casting a disk precursor using the seed of FIG. 4.

Also in the exemplary case one method in which the partially bonded bent seed assembly being introduced into a pre-fabricated shell mold was described in details. Several modifications of this method can also be practiced. In one case the partially bonded bent seed assembly 84 may be fitted around a ceramic core (e.g., a molded core) 350 and then an external shell mold 352 assembled to or built around that as shown in FIG. 13. Thus, for example, the assembly of seed 84 and core 350 may be inserted into a shell 352 that is pre-formed via shelling a wax pattern in the conventional manner. Alternatively, the assembly of seed 84 and core 350 may be over-molded with the wax for, in turn, receiving ceramic stucco in a shelling process to form the shell 352. Such processes discussed relative to FIG. 13 may have some advantages for preserving structural integrity of the large ceramic mold.

In yet another approach a pre-fabricated ceramic crucible can be used in place of the shell 352. Use of such a crucible may require modification of the geometry of the core 350 and may include inserting an additional core around the seed 84 in the base of the crucible. However, this may allow economical use of off-the-shelf crucibles instead of preparing shell molds from scratch for every casting.

In yet another alternative approach, a thick ceramic clamshell mold may be used, allowing a quick assembly and extraction of castings.

These variations in mold preparations are possible because unlike a single crystal blade with complex external shape and internal cooling passages, the casting shape requirements may be relatively simple and axially symmetric.

As is discussed above, the casting process may initially be used to make a seed precursor from which one may harvest multiple arcuate seeds for use in yet further casting stages. A mold may be designed specifically to make a long arcuate or full ring seed casting from which multiple seeds may be cut. Such an approach will help eliminate heat treatment, bending, and tack welding etc. of single crystal plates for producing seed assembly. More particularly, it may reduce the frequency of such steps as those steps might be used only to make a smaller number of master seeds 84, each of which might yield ten or more seed rings or seed arcuate segments.

Although the primary example has involved a full-annulus seed and casting, less than a full annulus seed may be used to form a full annulus component. Also, components of less than full annulus may be made. Examples of such components having arcuate cross-section are blade outer air seal (BOAS) segments, combustor panels, knife edge seals, drum rotors, and engine cases. Such segments and panels may be more likely than disks or other annular components to be directly cast rather than cast and forged.

In addition to a modified conventional directionally solidified casting process, various other processes may be used. A first alternative group of processes involve a modified Czochralski method using the arcuate segment or full-annulus seed. The Czochralski process is used in single crystal semiconductor growth and involves introducing a seed at the top of a body of molten material and drawing the seed and progressively solidifying material upward from the body. This can produce a cylindrical cast body. Thus, the body cast from a full annulus seed may be a generally tubular structure. This has possible advantages in the growth of relatively long bodies as might be used for shafts or portions thereof. Also since such process is primarily containerless, risk of contaminating the material with ceramic inclusions is reduced, which is considered very critical for improving fatigue life.

Figure 14:
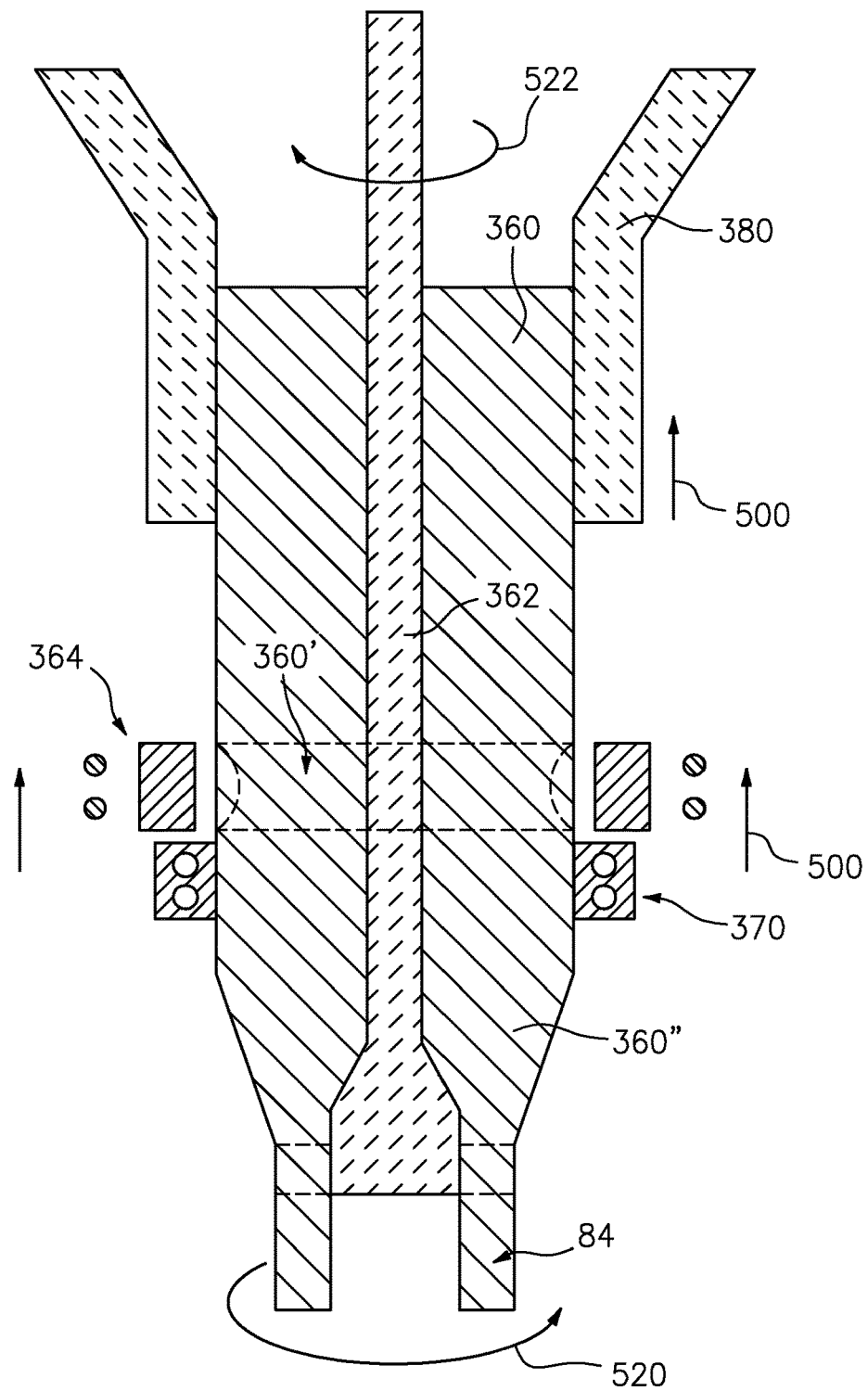
FIG. 14 is a partially schematic central vertical sectional view of a float casting system for casting an annular body using the seed of FIG. 4.

Also a float zone melting process may use the bent seed 84. In FIG. 14, a hollow cylinder 360 of starting material in polycrystalline form is held around a ceramic core 362 touching a bent seed assembly 84. Then a local heating element 364 (e.g., an induction coil surrounding a susceptor) is used to melt both the starting material and the seed such that liquid metal 360' is held in place by high viscosity, surface tension, and small volume. The heat source can be induction, electric resistance, or optical. Then either the heating zone is traversed away from the seed or the entire seed-starting material ingot is moved out of the heating zone. This allows the liquid metal in close contact with the seed to copy its local orientation in the direction of movement. In this particular example, the heating source 364 is shown at an intermediate stage of movement in a vertical direction 500. As noted above, the traversal starts with the source at even level with an upper portion of the seed to melt the seed upper portion. Then the traversal continues up along the height of the cylinder 360 leaving single crystal material 360" therebehind with crystalline orientation following that of the seed 84.

To increase thermal gradient, and help the solidification process, a cooling coil 370 may be used right below the hot zone. Thus, the cooling coil 370 may move vertically with the heat source 364 as a unit. In this type of float zone process it is customary to rotate the top and the bottom part of the solid cylinder counter to each other to help viscous liquid metal stay axially symmetric and better mixed. FIG. 14 shows the seed and solidified material 360" rotating in the direction 520 about the central vertical axis of the apparatus while the yet unmelted material 360 rotates in an opposite direction 522. This produces shearing in the melt zone 360'. This process facilitates casting of a long length of cylinder.

If continuous casting of the cylinder is required, optionally a ceramic feeder 380 can be provided to supply additional metal to increase the length of starting material. The exemplary feeder 380 may move with the heat source 364 as a unit; or the seed 84, core 362, and casting material may move downward with the feeder, heat source, and cooling means remaining fixed. For example, when the upper surface of the initial material 360 reaches a given threshold (proximity to the melt zone) another disk of material may be stacked atop with a central bore of the disk receiving the core 362. In yet further variants, sequential core extensions may mate to each other allowing essentially infinite casting.

Both the Czochralski process as well as the float zone process may also be particularly useful for bent seed formation of articles other than superalloy components. As removal grain boundaries as defects, help improve high temperature creep resistance, elimination of grain boundaries help improve memory alloy performance, electrical properties, magnetic properties, optical properties, as well as piezoelectric and many other physical properties. The resulting single crystal typically will make these properties anisotropic depending on the crystal symmetry. This generally limits application of material highly one directional. This could be limiting in many applications such as parabolic mirrors, lenses, micro machines, and actuators, where axial symmetry may be desirable. Use of bent single crystal seed(s) will open up such applications where some low angle grain boundaries can be tolerated to produce arcuate single crystal. It is recognized that with exception of memory alloys, in most of these application the material used are either intermetallics, maxphases, semi-metals such as silicon, ceramics, silicides, oxides, carbides, and other inorganic compounds, which are brittle. In such cases initially thin single crystal membrane may be used and bent elastically and then held in the elastically-bent state for use as a seed.

In the example above, case only axial forging was described as a method of warm working the solidified metal to change the shape and/or increase dislocation density. Alternatively, many other variations such as ring-rolling may be used to warm work a ring, in conjunction with forging or by itself. In such a process the ring is placed around an idle roller (or ID roller) and the ring is squeezed by a driver roller (OD roller) from the outside. The process is useful for expanding the ring diameter or for simply imparting some warm work to the metal from a different direction.

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when applied to an existing baseline part or casting apparatus configuration, details of such baseline may influence details of particular implementations. Accordingly, other embodiments are within the scope of the following claims.

What is claimed is:

1. A method for casting comprising:
   providing a seed, the seed characterized by:
   an arcuate form and a crystalline orientation progressively varying relative to a fixed frame of reference along an arc of the form;
   providing molten material; and
   cooling and solidifying the molten material so that a crystalline structure of the seed propagates into the solidifying material.

2. The method of claim 1 further comprising:
   partially melting the seed.

3. The method of claim 1 wherein the cooling and solidifying comprises:
   passing a solidification front through an arcuate planform passageway passing radially back and forth in a non-line-of-sight manner.

4. The method of claim 1 wherein:
   the seed has a weld or braze joint.

5. The method of claim 4 wherein:
   the weld or braze joint is partial height.

6. The method of claim 1 wherein:
   the seed is a full annulus.

7. The method of claim 1 further comprising forming the seed by:
   casting at least one precursor of the seed; and
   bending the at least one precursor into said arcuate form.

8. The method of claim 1 further comprising forming the seed by:
   bending at least one precursor of the seed into said arcuate form.

9. The method of claim 8 wherein:
   the bending is by at least 40°.

10. The method of claim 1 further comprising forming the seed by:
    assembling end-to-end a plurality of arcuate segments.

11. The method of claim 10 wherein:
    two to eight said segments combine to encircle at least 350° about a central longitudinal axis of the seed.

12. The method of claim 10 wherein the assembling comprises one or more of:
    clamping;
    welding; and
    brazing.

13. The method of claim 10 wherein the assembling comprises:
    tack welding.

14. The method of claim 1 wherein:
    the providing the molten material comprises pouring a molten metal.

15. The method of claim 14 further comprising:
    forging the solidified metal; and
    machining the forged metal.

16. The method of claim 15 wherein:
    a pre-forging height to diameter ratio is not greater than 1.0.

17. The method of claim 15 further comprising:
    ring rolling the solidified metal; and
    machining the rolled metal.

18. The method of claim 1 wherein the article is one of:
    a turbine engine disk or component thereof;
    a blade outer air seal;
    a combustor panel; or
    an engine case or component thereof.

19. The method of claim 1 wherein:
    the cooling and solidifying comprises downwardly shifting a shell.

20. The method of claim 1 wherein:
    the cooling and solidifying comprises upwardly drawing from a melt pool.

21. The method of claim 1 wherein:
the providing the molten material comprises a local melting with a heat source moving relative to the seed to melt material while leaving solid material above and below the melted material.

22. A disk manufacture method, comprising:
casting a first component according to the method of claim 1; and
bonding a second component concentrically within the first component.

* * * * *